(12) United States Patent
Hsu et al.

(10) Patent No.: US 6,751,151 B2
(45) Date of Patent: Jun. 15, 2004

(54) ULTRA HIGH-SPEED DDP-SRAM CACHE

(75) Inventors: Louis L. Hsu, Fishkill, NY (US);
Toshiaki K. Kirihata, Poughkeepsie, NY (US); Li-Kong Wang, Montvale, NJ (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 09/827,073

(22) Filed: Apr. 5, 2001

(65) Prior Publication Data

US 2002/0174298 A1 Nov. 21, 2002

(51) Int. Cl.[7] .............................. G11C 8/00; G11C 11/00
(52) U.S. Cl. .................. 365/230.05; 365/154; 365/156
(58) Field of Search .......................... 365/154, 156, 365/230.05

(56) References Cited

U.S. PATENT DOCUMENTS 5,541,874 A * 7/1996 O'Connor ................... 365/156
5,877,976 A * 3/1999 Lattimore et al. ........... 365/156
6,262,912 B1 * 7/2001 Sywyk et al. ................ 365/156
6,608,780 B2 * 8/2003 Shau ........................ 365/189.09

OTHER PUBLICATIONS

"An 8ns Random Cycle Embedded RAM Macro with Dual–Port Interleaved DRAM Architecture ($D^2RAM$)", Yasuhiro Agata et al, 2000 IEEE International Solid–State Circuits Conference, 9 pages.

* cited by examiner

*Primary Examiner*—Trong Phan
(74) *Attorney, Agent, or Firm*—Scully, Scott, Murphy & Presser; Robert M. Trepp, Esq.

(57) ABSTRACT

An ultra high-speed DDP-SRAM (Dual Dual-Port Static Random Access Memory) cache having a cache speed in approximately the GHz range. This is accomplished by (1) a specially designed dual-port SRAM whose size is slightly larger than that of a conventional single port SRAM, and (2) the use of a dual dual-port SRAM architecture which doubles its speed by interleaved read and write operations. A first embodiment provides a 6-T (transistor) all nMOS dual-port SRAM cell. A second embodiment provides a dual port 7T-SRAM cell which has only one port for write, and both ports for read.

8 Claims, 4 Drawing Sheets

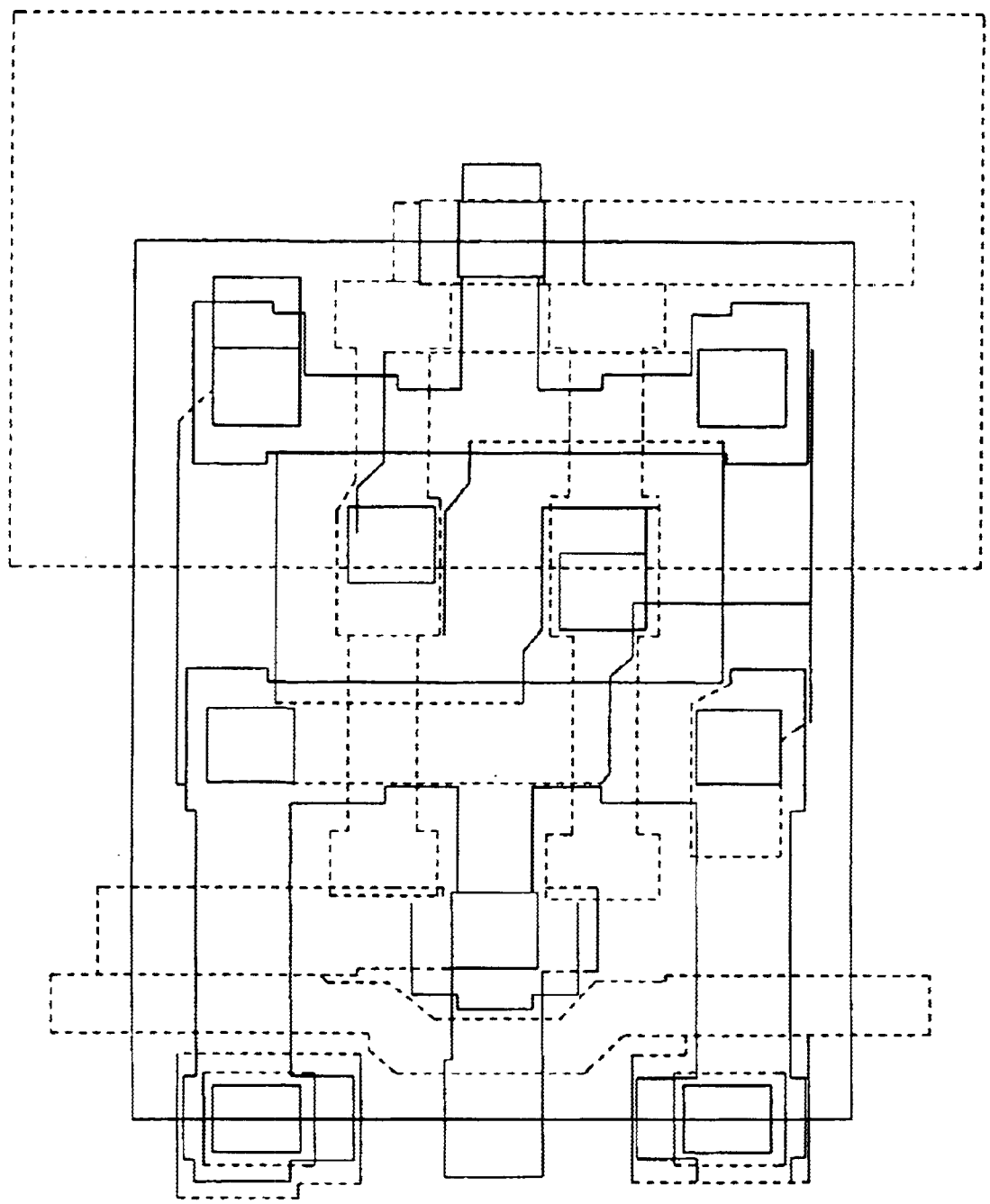
1 Port SRAM Cell
1.3 x 1.9 - 2.47
FIG. 1C(1)
*(Prior Art)*

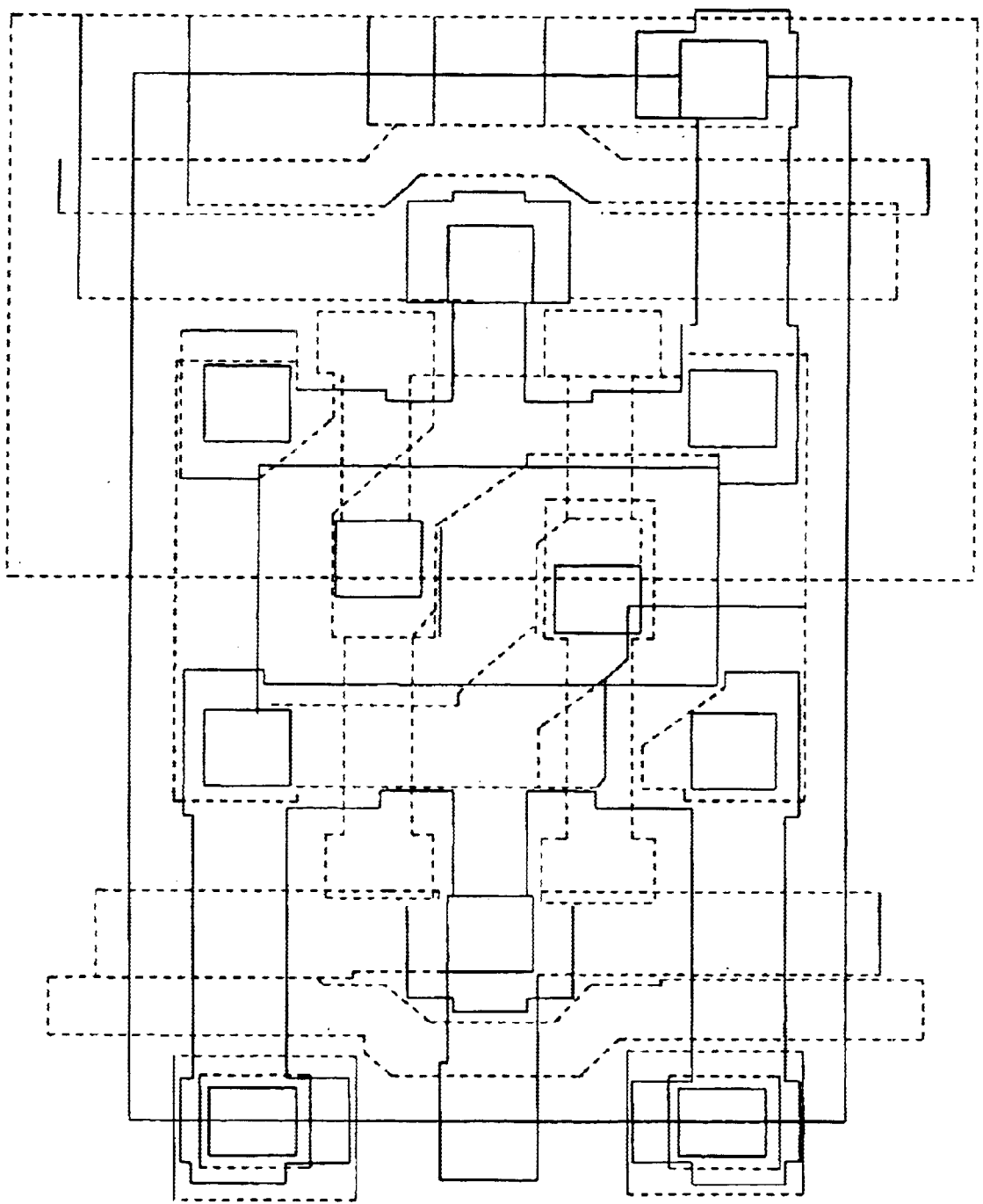
2 Port SRAM Cell
1.3 x 2.3 - 2.99
FIG. 1C(2)

Dual-Port RAM, Interleaved Write Operation

Dual-Port RAM, Interleaved Read Operation

ULTRA HIGH-SPEED DDP-SRAM CACHE

BACKGROUND OF THE INVENTION

1. Field of the Invention

The present invention relates generally to an ultra high-speed DDP-SRAM (Dual Dual-Port Static Random Access Memory) cache, and more particularly pertains to an ultra high-speed DDP-SRAM cache having a cache speed in approximately the GHz range. This is accomplished by (1) a specially designed dual-port SRAM whose size is slightly larger than that of a conventional single port SRAM, and (2) the use of a dual dual-port SRAM architecture which doubles its speed by interleaved read and write operations.

2. Discussion of the Prior Art

In general, SRAM (Static Random Access Memory) memory has a higher speed than DRAM (Dynamic Random Access Memory), however it's size is much larger. A conventional SRAM cell consists of six-transistors, two nMOS transistors as transfer devices, two pull-up pMOS transistors, and two pull-down nMOS transistors. The complementary data bits which are stored in a SRAM cell are latched by a pair of back-to-back inverters. Therefore, these data do not needed to be refreshed.

On the other hand, data that is stored in a one transistor, one capacitor DRAM cell gets degraded over a period of time due to charge leakage. Therefore, for any high-speed operation, especially when the required memory density is low, SRAM memory is always the memory of choice.

As the speed of microprocessors has increased over time, the speed gap between microprocessors and SRAM cache memories has also widened. Many GHz processors have been announced recently, but the speed of the SRAM cache is still in the range of 400 MHz.

A four-T (transistor) single-port SRAM cell has been reported by NEC, titled "A 2.9 um2 Embedded SRAM Cell with Co-Salicide Direct-Strap Technology for 0.18 um High Performance CMOS Logic", IEDM 97, p847, 1997. This single-port SRAM cell shares the transfer gates with the pull-up devices and therefore eliminates two devices per cell. This approach has significantly reduced the cell size, and surely is a very attractive design for a high-density integration. Since the pull-up and the transfer devices in NEC's cell are pMOS devices, for the unselected wordlines, the wordline voltage and all the bitline voltages are held high. The nodes are isolated since the pMOS devices are turned off. However, the leakage charge from the internal high node is constantly replenished by the off-state current flowing through the pMOS pull-up devices. There are two drawbacks with this design, (1) the cell size is not minimal, since the is a minimal ground rule specified between p-well and n-well for placing mixed pMOS and nMOS devices in a cell. (2) read/write disturb on the non-selected cell is an issue, since their bitlines are not constantly held high when the array is active.

SUMMARY OF THE INVENTION

Accordingly, it is a primary object of the present invention to provide an ultra high-speed DDP-SRAM (Dual Dual-Port Static Random Access Memory) cache.

A first object of the present invention is to boost SRAM cache speed by at least 2x. A second object of the subject invention is the design of a new dual-port SRAM cell, whose size is slightly larger (less than 25% larger) than the existing single-port SRAM cache.

A further object of the subject invention is to boost the cache speed to approximately the GHz range. This is accomplished by (1) a specially designed dual-port SRAM whose size is slightly larger than that of a conventional single port SRAM, and (2) the use of a dual dual-port SRAM architecture which doubles its speed by interleaved read and write operations.

BRIEF DESCRIPTION OF THE DRAWINGS

The foregoing objects and advantages of the present invention for an ultra high-speed DDP-SRAM cache may be more readily understood by one skilled in the art with reference being had to the following detailed description of several preferred embodiments thereof, taken in conjunction with the accompanying drawings wherein like elements are designated by identical reference numerals throughout the several views, and which:

FIG. 1C illustrates an area comparison between the prior art 6T single port SRAM and the 7T dual-port SRAM of the present invention.

DETAILED DESCRIPTION OF THE DRAWINGS

First Embodiment

Figure 1A:
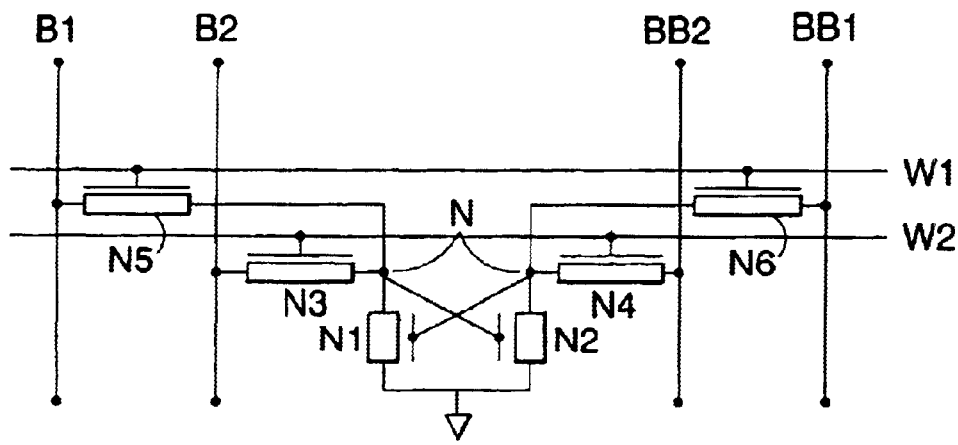
FIG. 1A illustrates a first embodiment of the present invention which provides a 6-T (transistor) all nMOS dual-port SRAM cell.

To overcome the drawbacks of the prior art, FIG. 1A illustrates a first embodiment of the present invention which provides a 6-T (transistor) all nMOS dual-port SRAM cell. As shown in FIG. 1A, the schematic of the cell comprises two pull-down nMOS devices, N1 and N2. Their sources are connected to ground, and each of the drains is connected to the sources of two transfer devices N3, N5 and N4, N6. Each gate is cross-couple linked to the other device's drain. A first pair of transfer nMOS devices N5 and N6 allow the internal nodes N to be accessed by the first pair of the bit-lines, B1 and BB1. A second pair of nMOS devices N3 and N4 allow the same internal nodes to be accessed by the second pair of bitlines, B2 and BB2. A first wordline W1 is connected to the gates of the first pair nMOS transfer devices N5, N6. A second wordline W2 is connected to the gates of the second pair nMOS transfer devices N3, N4.

When the cell is not selected, both wordlines W1 and W2 are held "low" to turn off the nMOS devices N3, N4, N5 and N6. The off-state current serves to replenish the charge stored in the storage nodes N. Since the pull-up devices N3, N4, N5, N6 are off, the channel resistance is in the range of M-ohm range, and therefore DC current is not a problem. At any one moment, only one wordline in a row is activated. Therefore, for the selected cells, there will always be a pair of pull-up devices to provide a constant load to the cells. As a result, the cells are more stable and less likely to be disturbed when compared to the 4-T single-port counterpart. Since all six devices used in the cell are nMOS transistors, they can be packed much denser than cells consisting of mixed nMOS and pMOS transistors. For a conventional dual-port SRAM, the array size is about 2.5× to 3× larger than that of the single-port SRAM. However, the dual-port SRAM cell of FIG. 1 can be 25% smaller than a 6-transistor single port SRAM. In general, the SRAM cell is limited by the device size, not by the wiring pitch.

Second Embodiment

A dual port DRAM used for some high-speed applications may not necessarily need to have a dual port with each port having both read and write capabilities. For example, one high-speed proposal requires only one port for write, and both ports for read.

Figure 1B:
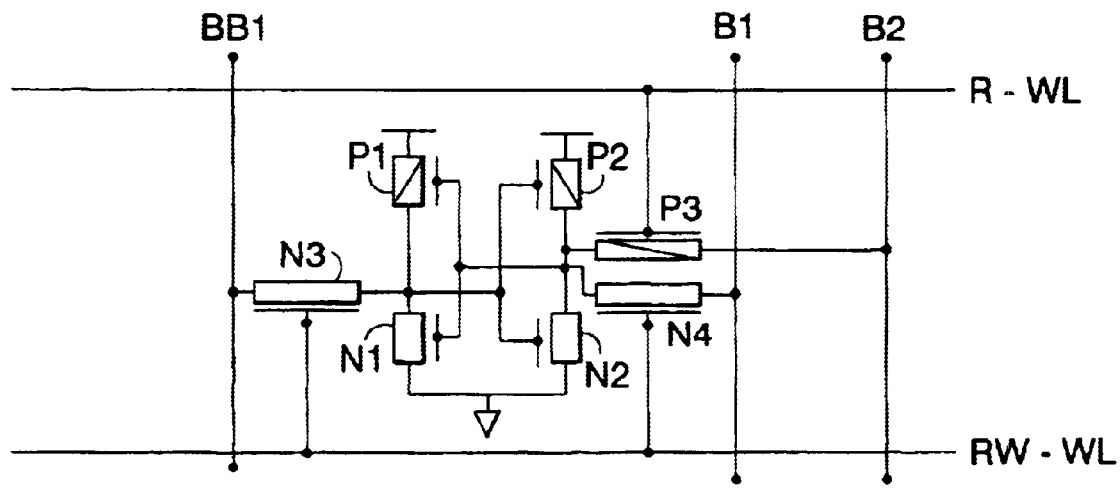
FIG. 1B illustrates a second embodiment of the present invention, and is a cell schematic of a new dual port 7T-SRAM cell which has only one port for write, and both ports for read.

FIG. 1B illustrates a second embodiment of the present invention, and is a cell schematic of a new dual port 7T-SRAM cell which has only one port for write, and both ports for read. In this design, the majority of components are identical to the prior art. These components are; two pMOS devices P1 and P2 used as the pull-up load, two nMOS devices N1 and N2 used as the pull-down drivers, and two nMOS transfer devices N3 and N4 used for accessing the internal nodes of the SRAM. A pair of bitlines B1 and BB1 are connected to the drain sides of the transfer devices N3 and N4. A readable and writeable wordline RW-WL is connected to the gates of the transfer devices N3 and N4.

The unique part of this cell is one extra pMOS transfer device P3 and one read-only wordline R-WL and one extra bitline B2 for accessing the second port. Compared to a conventional 8T SRAM, there is a significant area saving because of the elimination of one transistor and one bit-line which are not needed. The cell area of the conventional 8T dual port SRAM is about 2.5× larger than that of the single-port 6T SRAM. In this design as shown in FIG. 1C, the area overhead for the 7T dual port SRAM of the present invention is only 25% more than the 6T single port SRAM. This makes the array size of the dual-port SRAM very attractive. The 7T dual port SRAM has exactly the same stability, speed and power consumption as those of the 6T single port SRAM.

The dual-port SRAM can be accessed from the RW-WL (Read and Write Line) to write data into the array. The stored data can then be read out via either the Read only (R-WL) port or the read-write (RW-WL) port. Since the access gate for the read-only port is made of pMOS, the selected wordline must be pulled down from high to low, while the selected read-write port is pulled up from low to high.

The access device for the read-only port is made of pMOS is to save cell size. Since there is a minimum ground rule between N-well and P-well, it is easier to lay out the cell if the number of pMOS devices is equivalent to the number of nMOS devices. Since pMOS devices in general are larger than their nMOS counterparts, to minimize the SRAM cell size, the nMOS and pMOS sizes are balanced. The combination of four nMOS and three pMOS devices in the dual-port SRAM satisfies the goal.

FIG. 1C illustrates an area comparison between the prior art 6T single port SRAM and the 7T dual-port SRAM of the present invention.

FIG. 1C(1) illustrates a layout diagram of a prior art single port SRAM having overall dimensions of 1.3 um by 1.9 um for a cell size area of 2.47 um$^2$.

FIG. 1C(2) illustrates a layout diagram of the present invention dual port SRAM having overall dimensions of 1.3 um by 2.3 um for a cell size area of 2.99 um$^2$.

The cell size comparison is summarized in the following table based on IBM 8SF technology ground-rule.

| Type of SRAM Cell | Cell Size (um$^2$) | Ratio Overhead Against Conventional (%) |
|---|---|---|
| Conventional 6T, Single Port | 2.47 | 0% |
| NEC 4-T, Single Port | 1.68 | −32% |
| First Embodiment 6-T Dual Port | 2.70 | 9.3% |
| Second Embodiment 7-T, Dual Port | 2.88 | 16.6% |
| Conventional 8-T Dual Port | 6.18 | 150% |

Figure 2:
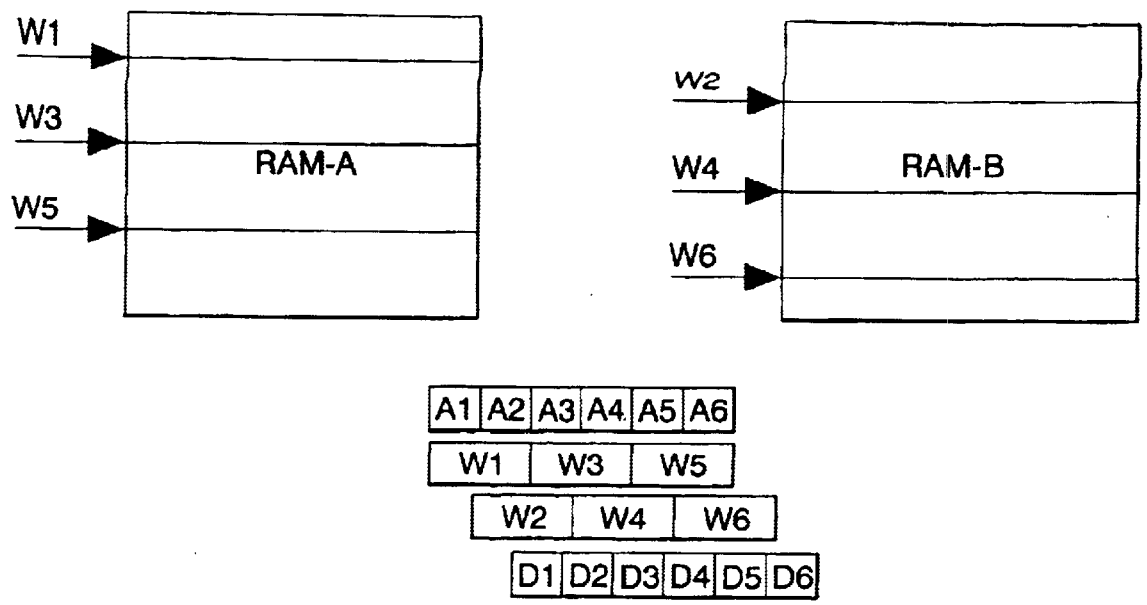
FIG. 2 illustrates an interleaved write operation for a dual port SRAM wherein the first data is written into the first array RAM-A in a first write operation W1, and after ½ cycle the second data is written into the second array RAM-B in a second write operation W2.

FIG. 2 illustrates an interleaved write operation for a dual port static(S) RAM having RAM-A and RAM-B, having row addresses, A1, A2, A3, A4, A5 and A6, datas D1, D2, D3, D4, D5 and D6, and executing interleaved write operations W1, W2, W3, W4, W5 and W6. In the interleaved write operations, the first data is written into the first array RAM-A in a first write operation W1, and after ½ cycle the second data is written into the second array RAM-B in a second write operation W2.

Figure 3:
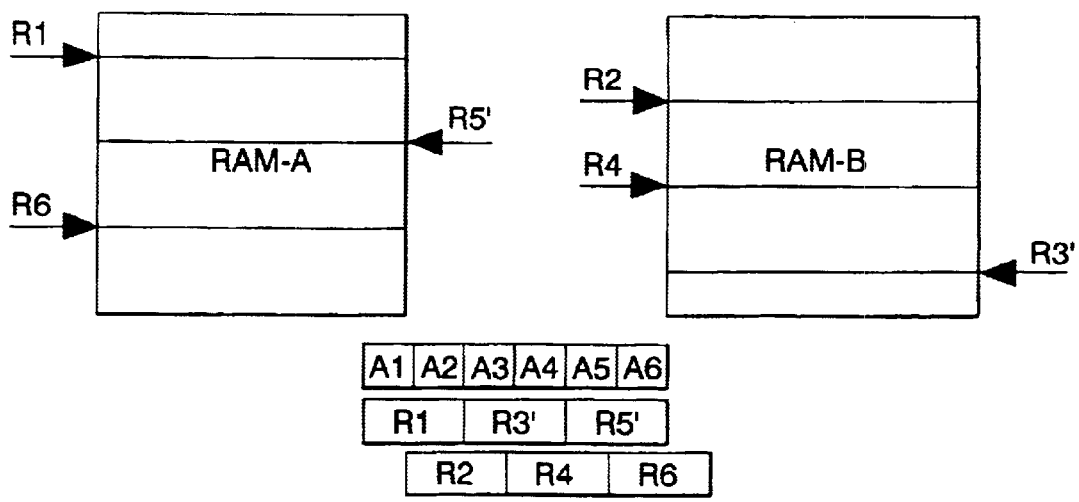
FIG. 3 illustrates an interleaved read operation for a dual port SRAM wherein either the first port or second port can be used for row accessing.

FIG. 3 illustrates an interleaved read operation for a dual port static(S) RAM, having RAM-A and RAM-B, wherein either the first port or second port can be used for row accessing. The dual port static(S) RAM has row addresses A1, A2, A3, A4, A5 and A6, and executes interleaved read operations R1, R2, R3, R4, R5 and R6 at different wordlines.

By using a dual dual-port (Or DDP) SRAM architecture, the SRAM performance can be boosted by at least by 2×. A memory array RAM-A, RAM-B performs consecutive write operations W1, W2, etc. in an interleaved manner. For example, in the beginning of the write cycle the first data is written into the first array RAM-A in a first write operation W1, and after ½ cycle, the second data is written into the second array in a second write operation W2, as shown in FIG. 2. Externally, the dual memory array is viewed as one memory. A TAG memory keeps track of the valid word lines which have stored data in the first and second memories of the array. When the cache receives a first row address A1, it will place the data D1 into the memory of the array which is available at that moment. Normally, one array memory is busy, and the other array memory is not. After ½ cycle, the cache receives a second row address A2 and writes the data D2 into the other array memory at that row. This interleaved writing can achieve 2× of memory speed, (or cycle time).

The advantage of using two dual-port arrays is that once the data is written into the memory, the data can be accessed from either port. For example, data that is written into the first array RAM-A in a first wordline W1 can be accessed from either the left or right port of the array for a read operation. In order not to disturb the unselected cells, in each cycle only one wordline of the dual-port array is activated.

For each new write operation, the address is checked with the addresses stored in a small TAG memory to find out where the stored data of that wordline is located, in RAM-A or RAM-B. If it is in RAM-A, and RAM-A is free, then the old data is written over by the new data, and the data of that wordline is marked "valid". However, if RAM-A is not available, than the new data is written to the other array memory RAM-B, and the valid data in the TAG address is updated so that the CPU knows where the latest data is stored.

Each read operation can be through either port of the RAM. Therefore, within all ½ cycle, almost all wordlines in both arrays can be accessed for a read operation. During each read, since the bit-lines drop to almost 100 mV, a disturb due to two wordline activations through different ports is not a concern. As shown in the example of FIG. 3, a first wordline is selected for a read R1 in RAM-A, and therefore either the first port or second port can be used for row accessing. After ½ cycle, a second wordline residing in RAM-B is activated for a read R2, so the first port is used for the row access. After the next ½ cycle, a third wordline in the same array RAM-B is accessed, and then the second port must be used for read R3'. Similarly, read R4 also occurs in the ½ cycle to the first port, while reads R5' and R6 are located in the same array RAM-A via two different ports. In summary, interleaved read or write operations can boost the cycle time to about 1 ns, so that the SRAM will appear to operate at 1 GHz.

While several embodiments and variations of the present invention for an ultra high-speed DDP-SRAM cache are described in detail herein, it should be apparent that the disclosure and teachings of the present invention will suggest many alternative designs to those skilled in the art.

Having thus described our invention, what we claim as new, and desire to secure by Letters Patent is:

1. A dual port SRAM cell comprising six nMOS devices,
   two nMOS pull-down devices,
   two nMOS first pair of transfer devices,
   two nMOS second pair of transfer devices,
   a first pair of bitlines coupled to the drains of the first pair of transfer devices,
   a second pair of bitlines coupled to the drains of the second pair of transfer devices,
   a first wordline coupled to the gates of the first pair of transfer devices, and a second wordline coupled to the gates of the second pair of transfer devices,
   wherein, when one pair of nMOS transfer devices is activated by its coupled wordline, the other pair of nMOS transfer devices function as load pull-up devices.

2. The dual port SRAM cell of claim 1, wherein said first wordline is the first port for read and write operations.

3. The dual port SRAM cell of claim 1, wherein said second wordline is the second port for read and write operations.

4. A dual port SRAM cell comprising four nMOS and three pMOS devices,
   first and second nMOS pull-down devices,
   first and second pMOS pull-up devices,
   first and second nMOS transfer devices,
   a single pMOS transfer device,
   first and second bitlines coupled respectively to the drains of the first and second nMOS transfer devices,
   a third bitline coupled to the drain of the single pMOS transfer device,
   a first wordline coupled to the gates of the first and second nMOS transfer devices, and
   a second wordline coupled to the gate of the single pMOS transfer device.

5. The dual port SRAM cell of claim 4, wherein said first wordline is the first port for read and write operations.

6. The dual port SRAM cell of claim 4, wherein said second wordline is the second port for read-only operations.

7. The dual port SRAM cell of claim 4, wherein the dual port SRAM cell is composed of only three bitlines.

8. The dual port SRAM cell of claim 4, wherein the dual port SRAM cell is composed of only three transfer devices.

* * * * *